United States Patent [19]

Mizuochi et al.

[11] Patent Number: 4,966,863
[45] Date of Patent: Oct. 30, 1990

[54] METHOD FOR PRODUCING A SEMICONDUCTOR LASER DEVICE

[75] Inventors: Hitoshi Mizuochi; Hideyo Higuchi, both of Itami, Japan

[73] Assignee: Mitsubishi Denki Kabushiki Kaisha, Japan

[21] Appl. No.: 378,692

[22] Filed: Jul. 11, 1989

[30] Foreign Application Priority Data

Jul. 20, 1988 [JP] Japan .................... 63-182393

[51] Int. Cl.⁵ .......................................... H01L 21/20
[52] U.S. Cl. ......................... 437/129; 148/DIG. 25; 148/DIG. 66; 148/DIG. 95; 372/48; 437/81; 437/117; 437/133
[58] Field of Search .................. 148/DIG. 25, 26, 51, 148/56, 65, 66, 72, 95, 97, 110, 169; 156/610–614, 644, 662; 372/43, 46, 48, 50, 96; 357/16, 17; 437/81, 105, 89, 107, 114, 117, 126, 129, 133

[56] References Cited

U.S. PATENT DOCUMENTS

| | | | |
|---|---|---|---|
| 4,355,396 | 10/1982 | Hawrylo et al. | 437/129 |
| 4,504,952 | 3/1985 | Hartman et al. | 372/48 |
| 4,509,996 | 4/1985 | Greene et al. | 437/129 |
| 4,573,255 | 3/1986 | Gordon et al. | 437/129 |
| 4,660,208 | 4/1987 | Johnston, Jr. et al. | 357/17 |
| 4,675,710 | 6/1987 | Ishikawa et al. | 357/17 |
| 4,701,995 | 10/1987 | Dolan et al. | 437/129 |
| 4,728,625 | 3/1988 | Namizaki et al. | 437/129 |
| 4,837,775 | 6/1989 | Andrews et al. | 372/96 |
| 4,879,724 | 11/1989 | Matsumoto et al. | 372/48 |

FOREIGN PATENT DOCUMENTS

| | | | |
|---|---|---|---|
| 0220486 | 12/1983 | Japan | 372/48 |
| 0112673 | 6/1984 | Japan | 372/48 |
| 0112674 | 6/1984 | Japan | 372/48 |
| 0124183 | 7/1984 | Japan | 372/48 |
| 0175783 | 10/1984 | Japan | 372/48 |

OTHER PUBLICATIONS

Ohshima et al., "Stable Longitudinal-Mode InGaAsP-/InP . . . Laser", IEEE J. Quantum Electronics, vol. QE-21, No. 6, Jun. 1985, pp. 563–567.

Alfreov et al., ". . . Injection Lasers Fabricated by Hybrid Vapor and Liquid-Phase Epitoxy", Sov. Tech. Phys. Lett., vol. 12, No. 5, May 1986, pp. 236–237.

*Primary Examiner*—Olik Chaudhuri
*Assistant Examiner*—William Bunch
*Attorney, Agent, or Firm*—Leydig, Voit & Mayer

[57] ABSTRACT

A semiconductor laser device includes a current blocking structure having a p-n-p-n structure, provided on a first conductivity type semiconductor substrate, an active region buried in a stripe shaped groove produced in the current blocking structure, a lower cladding layer grown by liquid phase epitaxy approximately filling the stripe groove, an active layer on the lower cladding layer in the stripe groove, a waveguide layer on the active layer completely filling the groove, and a diffraction grating on the waveguide layer.

1 Claim, 2 Drawing Sheets

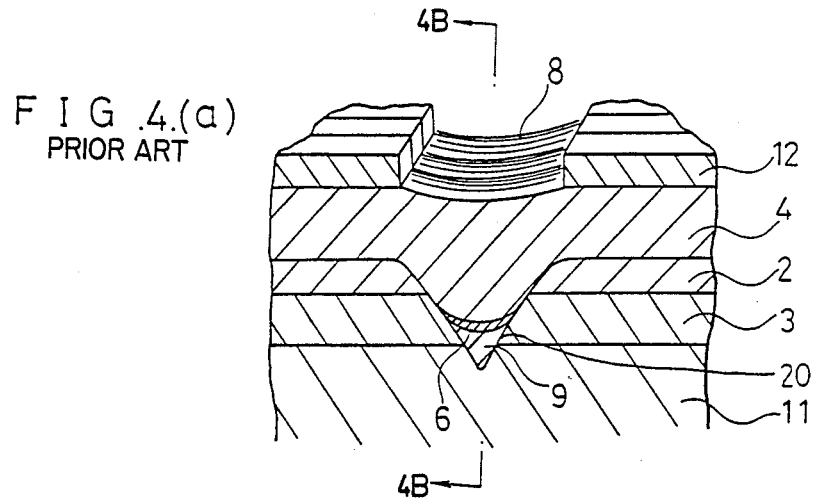
FIG.4.(a) PRIOR ART
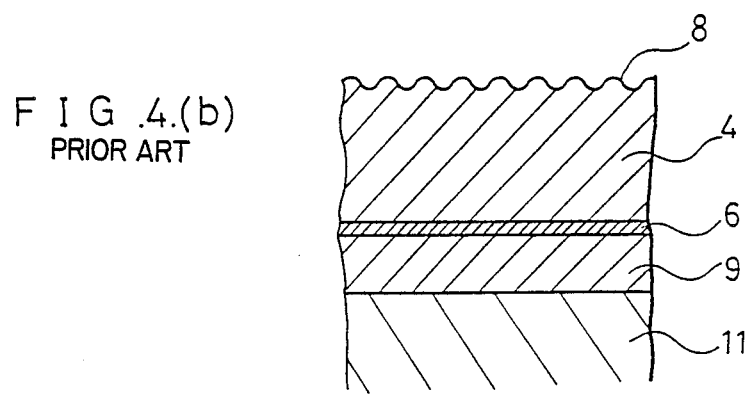
FIG.4.(b) PRIOR ART

METHOD FOR PRODUCING A SEMICONDUCTOR LASER DEVICE

FIELD OF THE INVENTION

The present invention relates to semiconductor laser devices and a production method therefor and, more particularly, to a laser having a dynamic single mode (hereinafter referred to as DSM) oscillation.

BACKGROUND OF THE INVENTION

FIG. 4a shows a cross-sectional view of a prior art semiconductor laser device conducting a single mode oscillation, which is disclosed in Applied Physics Letters 49(18), Nov. 3, 1986, pages 1148-1150. FIG. 4b shows a cross-sectional view taken along line B-B' of FIG. 4a. The laser includes an n type InP substrate 11. An p type InP current blocking layer 3 is disposed on substrate 11. A n type InP current blocking layer 2 is disposed on blocking layer 3. These blocking layers 2 and 3 are discontinuous, being separated by V-shaped groove 20. An n type InP cladding layer 9 is buried in the V-shaped groove 20. An InGaAsP active layer 6 is disposed on cladding layer 9. A p type InP cladding layer 4 is disposed on active layer 6 and blocking layers 2 and 3. A diffraction grating 8 is produced on p type InP cladding layer 4 opposite the V-shaped groove. A p type InGaAsP contact layer 12 is disposed on the cladding layer 4. (Buried Crescent) or V-shaped groove structures are suitable for achieving the desirable characteristics of semiconductor lasers, such as low threshold current, high power output, and fundamental transverse mode oscillation, the diffraction grating cannot be produced in the groove. Therefore, in this prior art laser device, after producing a semiconductor laser of the Fabry-Perot type having a V-shaped groove structure by liquid phase epitaxy, diffraction grating 8 is produced on the last epitaxially grown p type InP cladding layer 4 by an electron beam deposition method. In this structure, the distance between the diffraction grating 8 and active layer 6 is 0.7 micron.

The diffraction grating and active layer must be close to each other to achieve single longitudinal mode oscillation. The optimum distance between them may be about 0.2 micron. However, the above described structure of the prior art semiconductor laser does not meet this condition. Since the diffraction grating is produced on the last epitaxially grown layer (p-InP cladding layer 4), the diffraction grating is located far from the active layer, making single longitudinal mode oscillation difficult. Therefore, a secondary diffraction grating 8 (having period of 0.46 micron) of 0.3 micron height is utilized here.

SUMMARY OF THE INVENTION

It is an object of the present invention to provide a semiconductor laser device having a BC or V-shaped groove structure in which the diffraction grating is produced near the active layer that is capable of achieving stable single longitudinal mode oscillation with a primary diffraction grating.

Another object of the present invention is to provide a method of producing such a semiconductor laser device.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to an aspect of the present invention, a lower cladding layer is grown in a stripe groove, to approximately filling up the groove, by liquid phase epitaxy. An active layer and a waveguide layer are grown on the lower cladding layer completely filling up the groove by a MOCVD (metal organic chemical vapor deposition) or VPE (vapor phase epitaxy), and a diffraction grating is produced on the waveguide layer. Thus, the diffraction grating can be produced at a position close to the active layer enabling a stable single longitudinal mode oscillation in a semiconductor laser having BC or V-shaped groove structure which is superior in terms of low threshold current and high power output.

BRIEF DESCRIPTION OF THE DRAWINGS

FIGS. 1 to 3 are sectional views illustrating a production process for a semiconductor laser device according to an embodiment of the present invention, wherein FIG. 3a is a cross-sectional view including the laser oscillation region of the device and FIG. 3b is a cross-sectional view taken along line A-A' of FIG. 3a; and FIGS. 4(a) and 4(b) are sectional views of a semiconductor laser device according to the prior art.

DETAILED DESCRIPTION OF THE PREFERRED EMBODIMENTS

An embodiment of the present invention will be described in detail with reference to the drawings.

Figure 1:
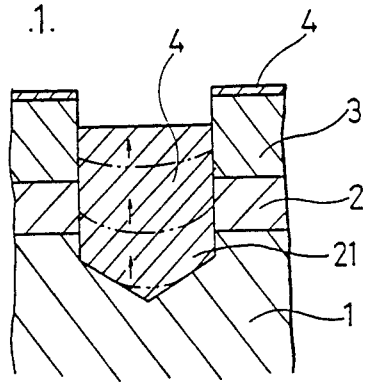
Figure 2:
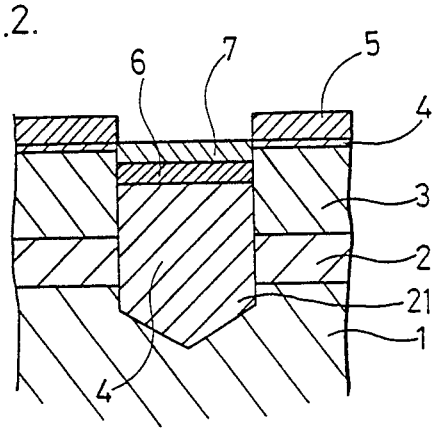
Figure 3:
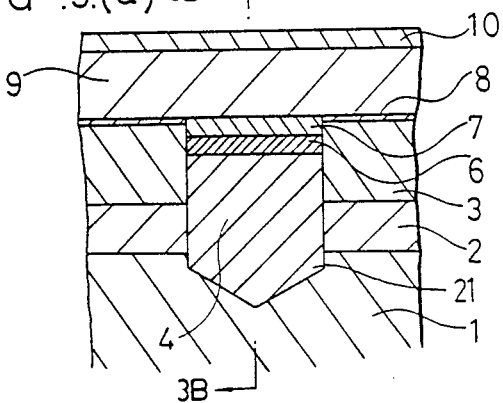
Figure 3:
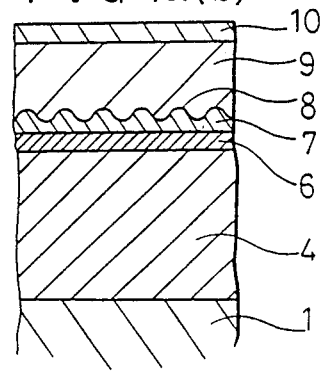

FIGS. 1 to 3 are diagrams showing a production process for producing a semiconductor laser device according to an embodiment of the present invention. In FIG. 1, a p type InP cladding layer 4 is grown in a V-shaped groove to approximately filling a groove 21 of a semiconductor laser device having a BC or V-shaped groove structure. This laser device includes a p type InP substrate 1. A p type InP current blocking layer 3 is disposed on the blocking layer 2. These blocking layers 2 and 3 are discontinuous, being separated by groove 21. As shown in FIG. 2, an InGaAsP active layer 6 and an InGaAsP waveguide layer 7 having a lower refractive index than that of the active layer 6 are grown on the p type InP cladding layer 4 completely filling up the V-shaped groove. As shown in FIG. 3, a diffraction grating 8 is produced on the waveguide layer 7 and the p type InP current blocking layer 3. The n type InP cladding layer 9 and the n type InGaAsP contact layer 10 are further disposed on the diffraction grating 8.

The production method of the semiconductor laser device will be described in the following.

First of all, in a first crystal growth step, an n type InP current blocking layer and a p type InP current blocking layer are grown on the p type InP substrate 1 by liquid or vapor phase epitaxy. Thereafter, a groove of 1 to 2 microns width is defined by photolithography and etched to a depth of 4 to 5 micron by wet etching. Next, in a second crystal growth step, a p type InP cladding layer 4 is grown in the groove up to by liquid phase epitaxy filling up a large portion of the groove. In the liquid phase epitaxy, as the crystal starts to grow from the bottom of the groove, the p type InP cladding layer 4 fills up a groove in the crescent shape. When the cladding layer 4 is grown to near the top portion of the groove, the surface of the cladding layer 4 is flat as shown in FIG. 1. The p type InP cladding layer 4 is stopped when the growth of the thickness becomes 3.5 to 4.5 microns. Herein, although the p type InP cladding layer 4 is slightly grown on the p type InP current blocking layer 3 outside the groove, this does not matter because the cladding layer 4 and the current blocking layer 3 have the same conductivity type and the same composition. Next, after depositing an SiN insulating film 5 outside the groove, the InGaAsP active layer 6 and the InGaAsP waveguide layer 7 having a lower refractive index than that of the active layer 6 are grown on the cladding layer 4 completely filling up the groove. Herein, the thicknesses of the active layer 6 and the waveguide layer 7 are 0.1 to 0.2 microns, respectively. In a case where the wavelength of the active layer 6 is 1.3 microns, the composition proportion of InGaAsP of the waveguide layer 7 is set at a value which makes the wavelength of the waveguide layer 7 1.1 microns, and in a case where the wavelength of the active layer is 1.55 microns, the composition proportion of InGaAsP of the waveguide layer 7 is to be set at a value which makes the wavelength of the waveguide layer 7 1.3 microns. The greatest advantage of utilizing the MOCVD or VPE methods is that the active layer 6 and the waveguide layer 7 can be grown to thickness of 0.1 microns with high reproducibility and high uniformity. Furthermore, the morphology of the surface of the epitaxial growth layer after LPE can be controlled, thereby simplifying the production of the diffraction grating 8 at the later process steps. Next, after removing the SiN film 5, a resist is deposited and patterned utilizing photolithography or interference exposure, and etched, thereby producing the diffraction grating. Since the distance between the diffraction grating 8 and the active layer 6 is only 0.1 to 0.2 microns, the primary diffraction grating can be used. Furthermore, the diffraction grating 8 is also produced on the p type InP current blocking layer 3 outside the groove. After producing the diffraction grating 8, the n type InP cladding layer 9 and the n type InGaAsP contact layer 10 are successively grown thereon with utilizing either of the LPE or MOCVD methods.

In the above-described embodiment, the diffraction grating is produced close to the active layer even in a BC structure, and this results in a semiconductor laser device having a low threshold current and a high power output, and which is capable of single longitudinal mode oscillation.

While in the above-illustrated embodiment a semiconductor laser device of the BC structure is described, the present invention can be also applied to a semiconductor laser device of having V-shaped groove structure with the same effects as described above.

As discussed above, according to the present invention, a lower cladding layer is grown in a stripe groove approximately filling up the groove by liquid phase epitaxy, an active layer and a waveguide layer are grown on the lower cladding layer up to completely filling up the groove by MOCVD or VPE growth, and a diffraction grating is produced on the waveguide layer. Accordingly, the diffraction grating can be produced at a position close to the active layer, and this enables a stable single longitudinal mode oscillation in a semiconductor laser of having a BC or V-shaped groove structure which is superior in low threshold current and high power output operation.

What is claimed is:

1. A method for producing a semiconductor laser including a p-n-p-n current blocking structure disposed on a first conductivity type semiconductor substrate and an active region buried in a stripe groove formed in said current blocking structure comprising:
   growing a lower cladding layer in a stripe groove in a substrate by liquid phase epitaxy, nearly filling the groove;
   successively growing an active layer and a waveguide layer by one of liquid phase epitaxy and metal organic chemical vapor deposition on said lower cladding layer, completely filling said groove; and
   forming a diffraction grating on said waveguide layer.

* * * * *